(12) United States Patent
Yang

(10) Patent No.: US 10,629,751 B2
(45) Date of Patent: Apr. 21, 2020

(54) NANOWIRE TRANSISTOR STRUCTURE AND NANOWIRE INVERTER STRUCTURE

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/046,961

(22) Filed: Jul. 26, 2018

(65) Prior Publication Data

US 2019/0386150 A1 Dec. 19, 2019

(30) Foreign Application Priority Data

Jun. 13, 2018 (CN) .......................... 2018 1 0605874

(51) Int. Cl.
| | | |
|---|---|---|
| *H01L 29/76* | (2006.01) | |
| *H01L 29/786* | (2006.01) | |
| *H01L 27/092* | (2006.01) | |
| *H01L 29/78* | (2006.01) | |
| *H01L 29/06* | (2006.01) | |
| *H01L 29/423* | (2006.01) | |

(Continued)

(52) U.S. Cl.
CPC .... *H01L 29/78696* (2013.01); *H01L 27/0886* (2013.01); *H01L 27/092* (2013.01); *H01L 27/0924* (2013.01); *H01L 27/1211* (2013.01); *H01L 29/0669* (2013.01); *H01L 29/0673* (2013.01); *H01L 29/42392* (2013.01); *H01L 29/66795* (2013.01); *H01L 29/775* (2013.01); *H01L 29/785* (2013.01); *H01L 29/7843* (2013.01)

(58) Field of Classification Search
CPC ......... H01L 29/78696; H01L 29/42392; H01L 29/0673; H01L 27/092; H01L 29/7843; H01L 27/0886; H01L 27/0924; H01L 27/1211; H01L 29/785; H01L 21/823821; H01L 29/775; H01L 21/823431; H01L 29/66795; H01L 29/0669
See application file for complete search history.

(56) References Cited

U.S. PATENT DOCUMENTS 9,000,530 B2 4/2015 Balakrishnan
9,530,876 B2 * 12/2016 Chang .................. H01L 29/775
(Continued)

OTHER PUBLICATIONS

Lee, Title of Invention: Method of Adjusting Signal to Noise Ratio of SRAM and Invertor Structure , U.S. Appl. No. 15/976,848, filed May 10, 2018.

(Continued)

*Primary Examiner* — Shouxiang Hu
(74) *Attorney, Agent, or Firm* — Winston Hsu

(57) ABSTRACT

A nanowire transistor structure includes a substrate. A first nanowire is suspended on the substrate. A first gate line crosses and surrounds the first nanowire. The first gate line includes a first end and a second end. A second gate line crosses and surrounds the first nanowire. The second gate line includes a third end and a fourth end. An interlayer dielectric encapsulates the first end, the second end, the third end and the fourth end. A first distance between the first end and the first nanowire is smaller than a third distance between the third end and the first nanowire.

10 Claims, 9 Drawing Sheets

(51) Int. Cl.
*H01L 27/12* (2006.01)
*H01L 27/088* (2006.01)
*H01L 29/775* (2006.01)
*H01L 29/66* (2006.01)

(56) References Cited

U.S. PATENT DOCUMENTS

| | | | |
|---|---|---|---|
| 2013/0234215 A1* | 9/2013 | Okano | H01L 29/42392 |
| | | | 257/255 |
| 2015/0370950 A1* | 12/2015 | Kawa | G06F 17/5072 |
| | | | 716/119 |
| 2016/0172360 A1* | 6/2016 | Shimbo | H01L 27/11807 |
| 2017/0033020 A1 | 2/2017 | Machkaoutsan | |

OTHER PUBLICATIONS

Chen, IEEE Xplore, Publication Year: 2015, pp. 110-115 title: Compact modeling solution of layout dependent effect for FinFET technology, Mar. 23, 2015.

* cited by examiner

NANOWIRE TRANSISTOR STRUCTURE AND NANOWIRE INVERTER STRUCTURE

BACKGROUND OF THE INVENTION

1. Field of the Invention

The present invention relates to a nanowire transistor structure and a nanowire inverter structure.

2. Description of the Prior Art

The integration of hundreds of millions of circuit elements such as transistors on a single integrated circuit necessitates further dramatic scaling down of the physical dimensions of circuit elements. Fabricating microelectronic devices which have higher performance, lower cost, increased miniaturization of integrated circuit components, and greater packaging density of integrated circuits are ongoing goals of the microelectronic industry. In order to achieve these highly integrated circuits, a nanowire-based device is introduced. Many different techniques have been attempted to fabricate nanowire device; however, improvements may still be need in the area of forming a nanowire device with high efficiency.

SUMMARY OF THE INVENTION

Accordingly, it is a primary object of the present invention to provide a nanowire transistor structure and a nanowire structure with better efficiency.

According to a preferred embodiment of the present invention, a transistor structure includes a substrate and a first nanowire suspended on the substrate. A first gate line crosses and surrounds the first nanowire, wherein the first gate line has a first end and a second end. A second gate line crosses and surrounds the first nanowire, wherein the second gate line has a third end and a fourth end. An interlayer dielectric layer encapsulates the first end, the second end, the third end and the fourth end. A first distance between the first end and the first nanowire is smaller than a third distance between the third end and the first nanowire.

According to another preferred embodiment of the present invention, a nanowire transistor structure includes a substrate, and a first nanowire suspended on the substrate. A first gate line crosses and surrounds the first nanowire, wherein the first gate line comprises a first end and a second end. A second gate line crosses and surrounds the first nanowire, wherein the second gate line includes a third end and a fourth end. An interlayer dielectric layer encapsulates the first end, the second end, the third end and the fourth end, wherein a first distance between the first end and the first nanowire is larger than a third distance between the third end and the first nanowire.

According to another preferred embodiment of the present invention, an inverter structure includes a substrate comprising a first-type transistor region and a second-type transistor region. A first nanowire is suspended in the first-type transistor region. A second nanowire is suspended in the second-type transistor region, wherein the first nanowire is parallel to the second nanowire. A first gate line is disposed within the first-type transistor region and the second-type transistor region, and is perpendicular to the first nanowire, wherein the first gate line comprises a first end within the first-type transistor region and a second end within the second-type transistor region. A second gate line is disposed within the first-type transistor region and the second-type transistor region, and is perpendicular to the first nanowire, wherein the first gate line comprises a third end within the first-type transistor region, and a fourth end within the second-type transistor region. An interlayer dielectric layer encapsulates the first end, the second end, the third end and the fourth end, wherein a first distance between the first end and the first nanowire is larger than a third distance between the third end and the first nanowire, and a second distance between the second end and the second nanowire is smaller than a fourth distance between the fourth end and the second nanowire.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
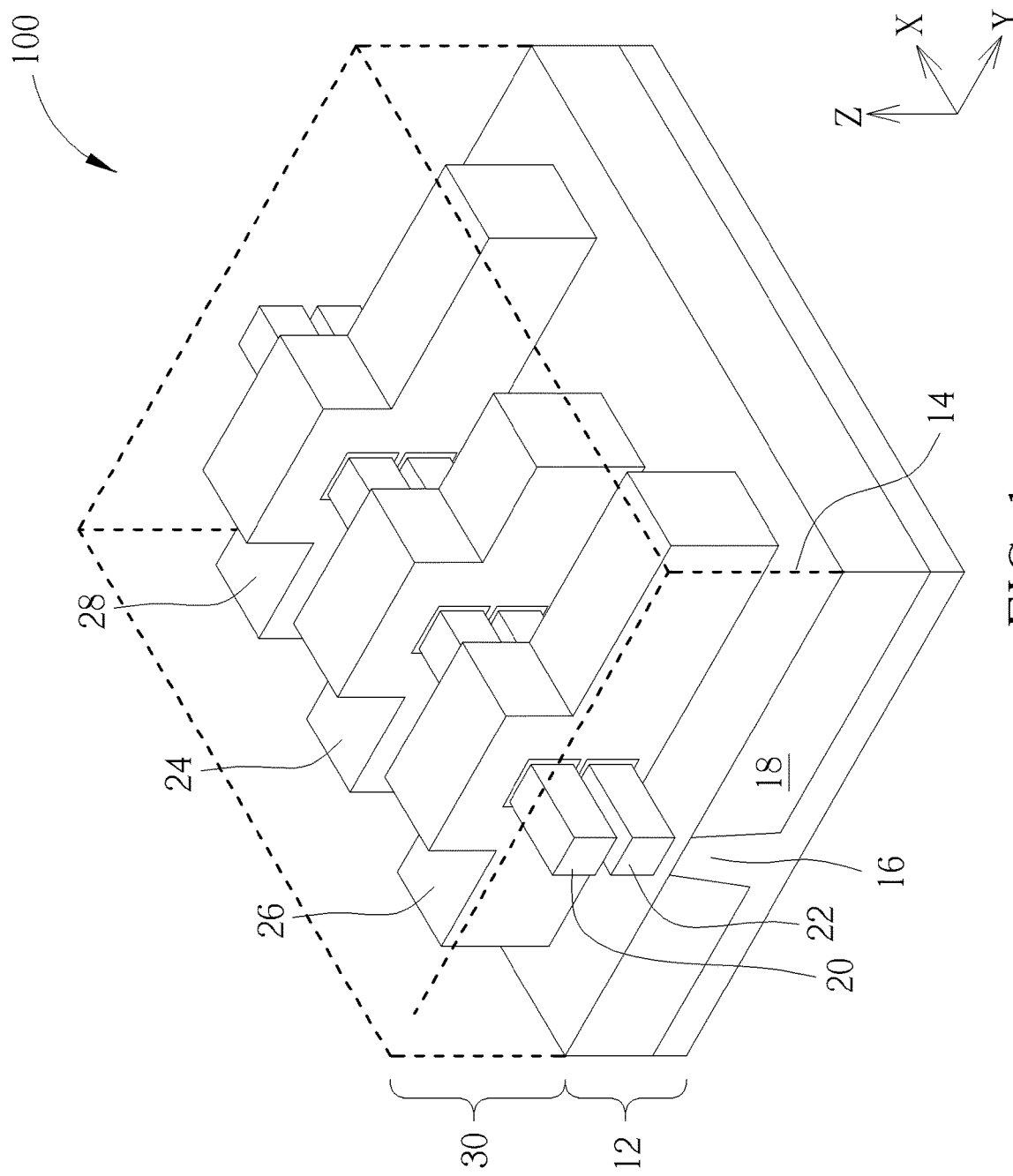
FIG. 1 depicts a three-dimensional figure of a nanowire transistor structure according to a first preferred embodiment of the present invention.
Figure 2:
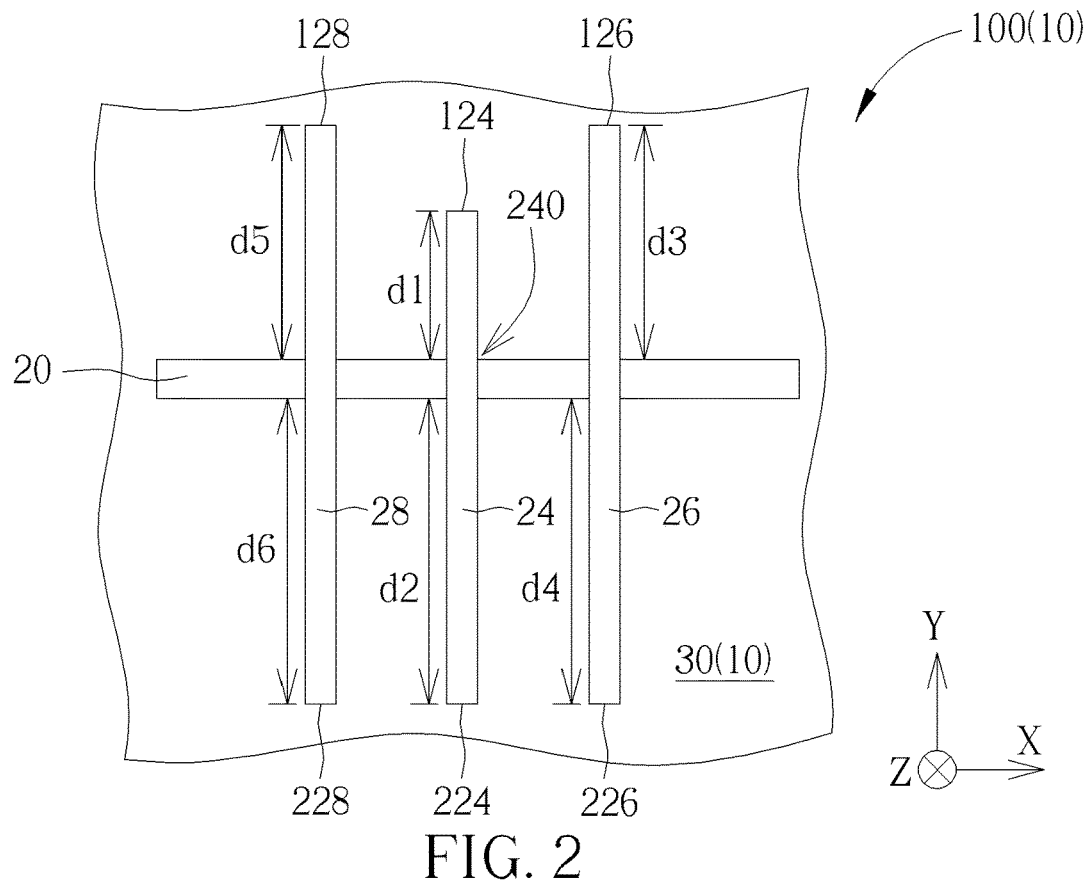
FIG. 2 shows a top view of FIG. 1.
Figure 3:
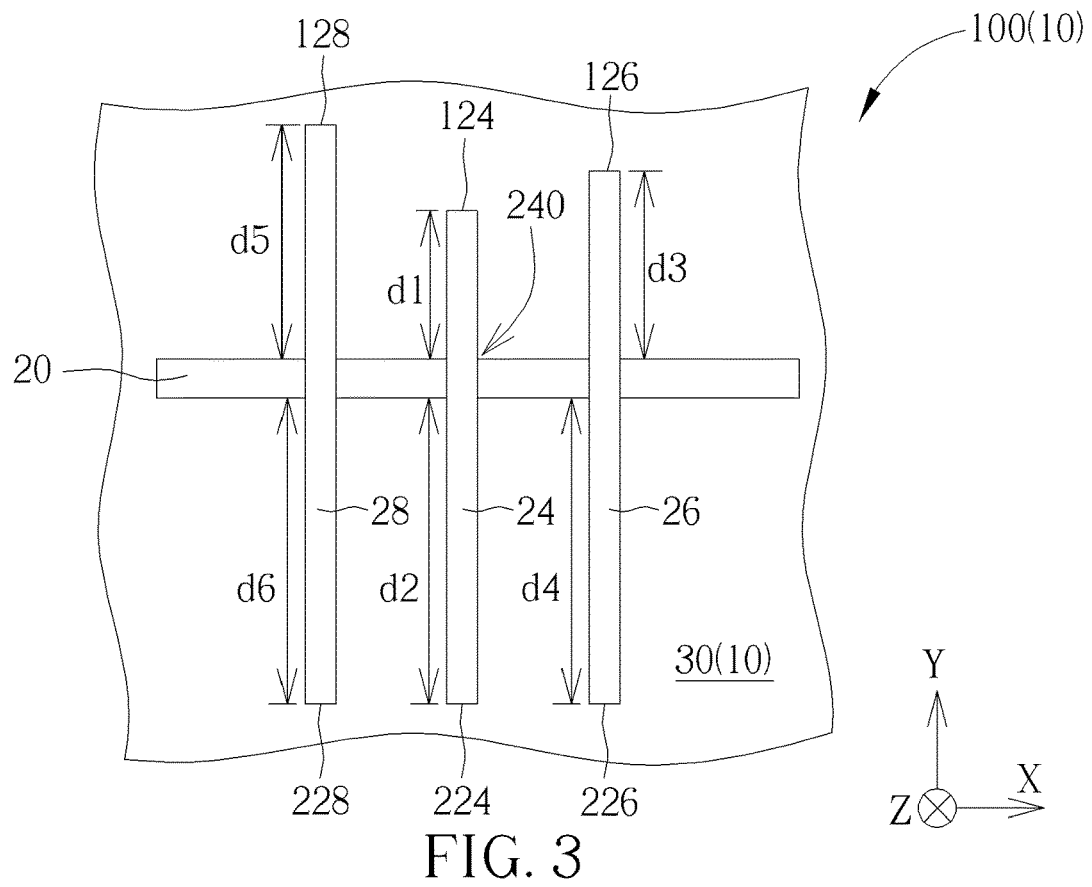
FIG. 3 depicts a nanowire transistor structure according to a modification of the first preferred embodiment of the present invention.
Figure 4:
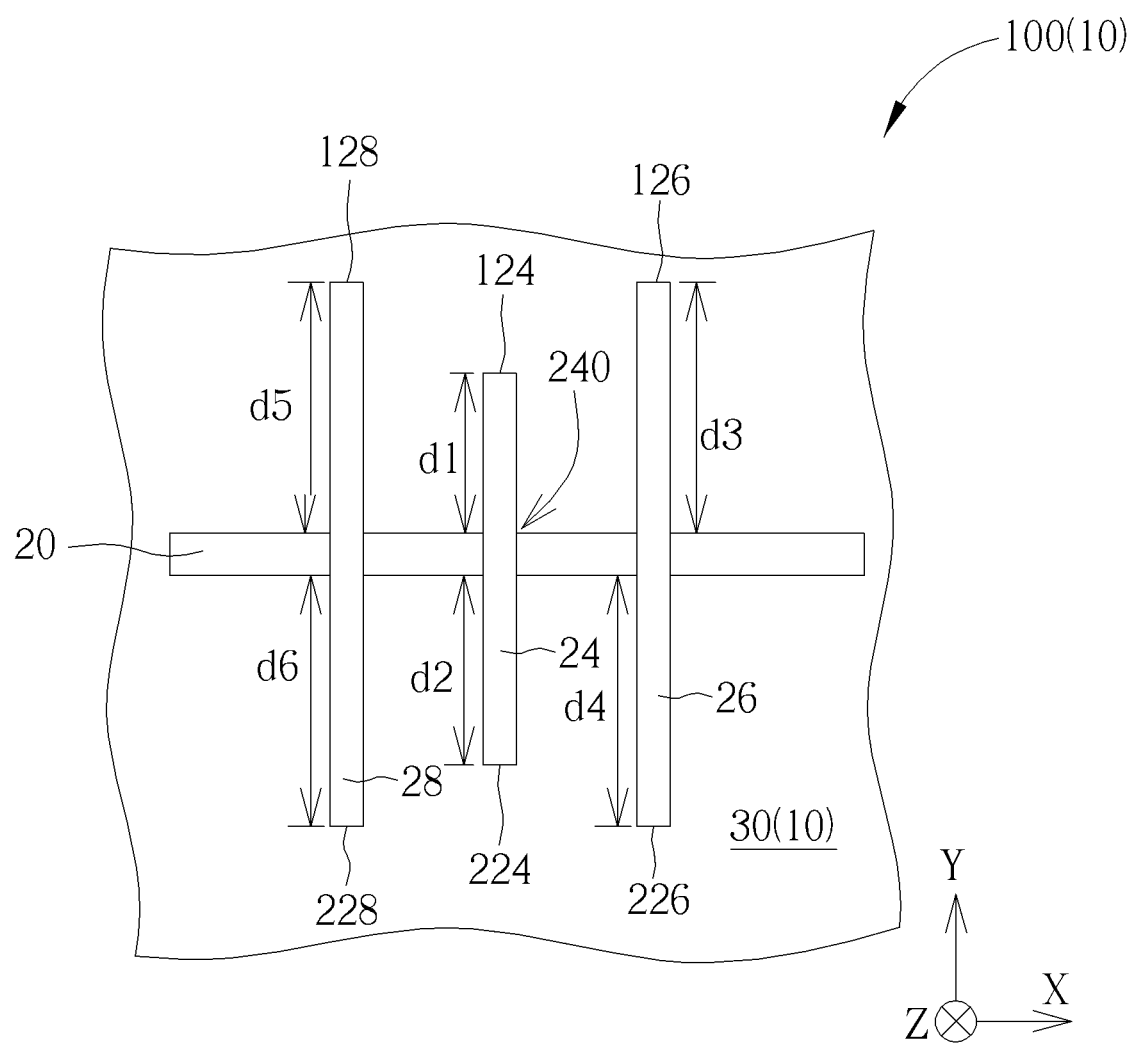
FIG. 4 depicts another nanowire transistor structure according to a modification of the first preferred embodiment of the present invention.

FIG. 1 depicts a three-dimensional figure of a nanowire transistor structure according to a first preferred embodiment of the present invention. FIG. 2 shows a top view of FIG. 1. FIG. 3 depicts a nanowire transistor structure according to a modification of the first preferred embodiment of the present invention in a top view. FIG. 4 depicts another nanowire transistor structure according to a modification of the first preferred embodiment of the present invention in a top view. In the present invention, like reference numerals are used to refer to like elements throughout.

Please refer to FIG. 1 and FIG. 2. A nanowire transistor structure 10 includes a substrate 12. A first direction X, a second direction Y and a vertical direction Z are defined on the substrate 12. The first direction X and the second direction Y are parallel to a top surface 14 of the substrate 12. The vertical direction Z is perpendicular to the top surface 14. The first direction X is perpendicular to the second direction Y. The substrate 12 includes a fin structure 16 and a shallow trench isolation (STI) 18 surrounding the fin structure 16. A first nanowire 20 is suspended on the substrate 12. The first nanowire 20 is disposed directly on the fin structure 16 and aligned with the fin structure 16 along the vertical direction Z. The first nanowire 20 is parallel to the first direction X. A second nanowire 22 can optionally be suspended on the substrate 12. The second nanowire 22 is disposed directly on the fin structure 16 and entirely aligned with the fin structure 16 along the vertical direction Z. The fin structure 16 may be a semiconductor material such as silicon, germanium, silicon germanium, or silicon carbide. The STI 18 is preferably silicon oxide or another insulating material. The material of the first nanowire 20 and the material of the second nanowire 22 are the same as that of the fin structure 16.

A first gate line 24 crosses and surrounds the first nanowire 20. The first gate line 24 includes a gate and a gate dielectric layer. The gate may be a conductive material such as doped polysilicon or metal. The gate dielectric layer may be silicon oxide ($SiO_2$), silicon nitride ($Si_3N_4$), silicon carbon nitride (SiCN), silicon oxynitride (SiON), silicon oxycarbonitride (SiOCN), or high-k dielectrics having a dielectric constant greater than 5. The first gate line 24 is parallel to the second direction Y. The first gate line 24 has a first end 124 and a second end 224. A second gate line 26 crosses and surrounds the first nanowire 20. The second gate line 26 and the first gate line 24 have the same structure and the same material. The second gate line 26 is parallel to the first gate line 24. The second gate line 26 has a third end 126 and a fourth end 226. The first end 124 and the third end 126 are disposed at the same side of the first nanowire 20. The second end 224 and the fourth end 226 are both disposed at another side of the first nanowire 20. It is noteworthy that a first distance d1 between the first end 124 and the first nanowire 20 is smaller than a third distance d3 between the third end 126 and the first nanowire 20. The first distance d1, the third distance d3 and the second direction Y are parallel to each other. Furthermore, a second distance d2 between the second end 224 and the first nanowire 20 equals a fourth distance d4 between the fourth end 226 and the first nanowire 20.

The nanowire transistor structure 10 preferably further includes a third gate line 28 which crosses and surrounds the first nanowire 20. The first gate line 24 is disposed between the second gate line 26 and the third gate line 28. The third gate line 28 and the first gate line 24 have the same structure and the same material. The third gate line 28 has a fifth end 128 and a sixth end 228. The first end 124 and the fifth end 128 are disposed at the same side of the first nanowire 20. The sixth end 228 and the second end 224 are both disposed at the same side of the first nanowire 20. The first distance d1 is smaller than a fifth distance d5 between the fifth end 128 and the first nanowire 20. The second distance d2 equals a sixth distance d6 between the sixth end 228 and the first nanowire 20. The fifth distance d5, the sixth distance d6 and the second direction Y are parallel to each other. In the embodiment in FIG. 2, the third distance d3 equals the fifth distance d5. In the modification of the nanowire transistor structure 10 shown in FIG. 3, the third distance d3 may not be equal to the fifth distance d5, as long as the third distance d3 and the fifth distance d5 are both larger than the first distance d1. In the nanowire transistor structure 10, except for the first gate line 24, each of the other gate lines has at least one end arranged following the rule that: the gate line nearer the first gate line 24 along the first direction X has an end nearer the first nanowire 20 along the second direction Y, the gate line farther from the first gate line 24 along the first direction X has an end farther from the first nanowire 20 along the second direction Y, and the distance between the end and the first nanowire 20 is not smaller than the first distance d1.

Furthermore, the first gate line 24 overlapping the first nanowire 20 forms a gate structure 240. Source/drain doped regions (not shown) can be formed in the first nanowire 20 at two sides of the gate structure 240. The gate structure 240, the first nanowire 20 and the source/drain doped regions form a nanowire transistor 100.

The second end 224 of the first gate line 24, the fourth end 226 of the second gate line 26 and the sixth end 228 of the third gate line 28 can be aligned to each other as shown in FIG. 2 and FIG. 3. In other cases, the second end 224, the fourth end 226 and the sixth end 228 are not aligned as shown in FIG. 4. In details, as shown in FIG. 4, the second distance d2 is smaller than the fourth distance d4 and the sixth distance d6. The fourth distance d4 equals the sixth distance d6. In other embodiments, the second distance d2 is smaller than the fourth distance d4 and smaller than the sixth distance d6, but the fourth distance d4 does not equal the sixth distance d6. Under the circumstance that the second end 224, the fourth end 226 and the sixth end 228 are not aligned, the efficiency of the nanowire transistor 100 is twice the efficiency of the nanowire transistor 100 has the second end 224, the fourth end 226 and the sixth end 228 aligned. The numbers of the nanowires and the gate lines of the nanowire transistor 100 in the FIG. 2 to FIG. 4 can be increased based on different requirements. The added nanowire can be disposed along the vertical direction Z, and be aligned with the first nanowire. The added gate line can be disposed at one side of the second gate line 26 or the third gate line 28. The position of the end of the added gate line can be disposed following the rule mentioned above. For example, as in example (a) of FIG. 11, a fourth gate line 32 is added to one side of the second gate line 26, and a fifth gate line 34 is added to one side of the third gate line 28. Compared to the second gate line 26, the fourth gate line 32 is farther from the first gate line 24 along the first direction X; therefore, a seventh distance d7 between an end 132 of the fourth gate line 32 and the first nanowire 20 is larger than the third distance d3 along the second direction Y. Compared to the third gate line 28, the fifth gate line 34 is farther from the first gate line 24 along the first direction X; therefore, a ninth distance d9 between an end 134 of the fifth gate line 34 and the first nanowire 20 is larger than the fifth distance d5 along the second direction Y. Moreover, the first gate line 24 has an applied voltage. The second gate line 26, and the third gate line 28 may have an applied voltage or be floating.

Please refer to FIG. 2, FIG. 3 and FIG. 4. An interlayer dielectric layer 30 encapsulates the first end 124, the second end 224, the third end 126 and the fourth end 226, the fifth end 128 and the sixth end 228. The interlayer dielectric layer 30 and the nanowire transistor 100 form the nanowire transistor structure 10. The interlayer dielectric layer 30 may be silicon nitride, silicon oxide or other insulating materials. The interlayer dielectric layer 30 includes stress, and the stress in the interlayer dielectric layer 30 is applied to the first end 124, the second end 224, the third end 126 and the fourth end 226, the fifth end 128 and the sixth end 228 to change the stress in the nanowire 20 of the gate structure 240; the efficiency of the nanowire transistor 100 is therefore increased. When the interlayer dielectric layer 30 is tensile stress, the gate structure 240 is a gate structure of an N-type transistor, and the nanowire transistor 100 is an N-type transistor; when the interlayer dielectric layer 30 is compressive stress, the gate structure 240 is a gate structure of a P-type transistor, and the nanowire transistor 100 is a P-type transistor.

Figure 5:
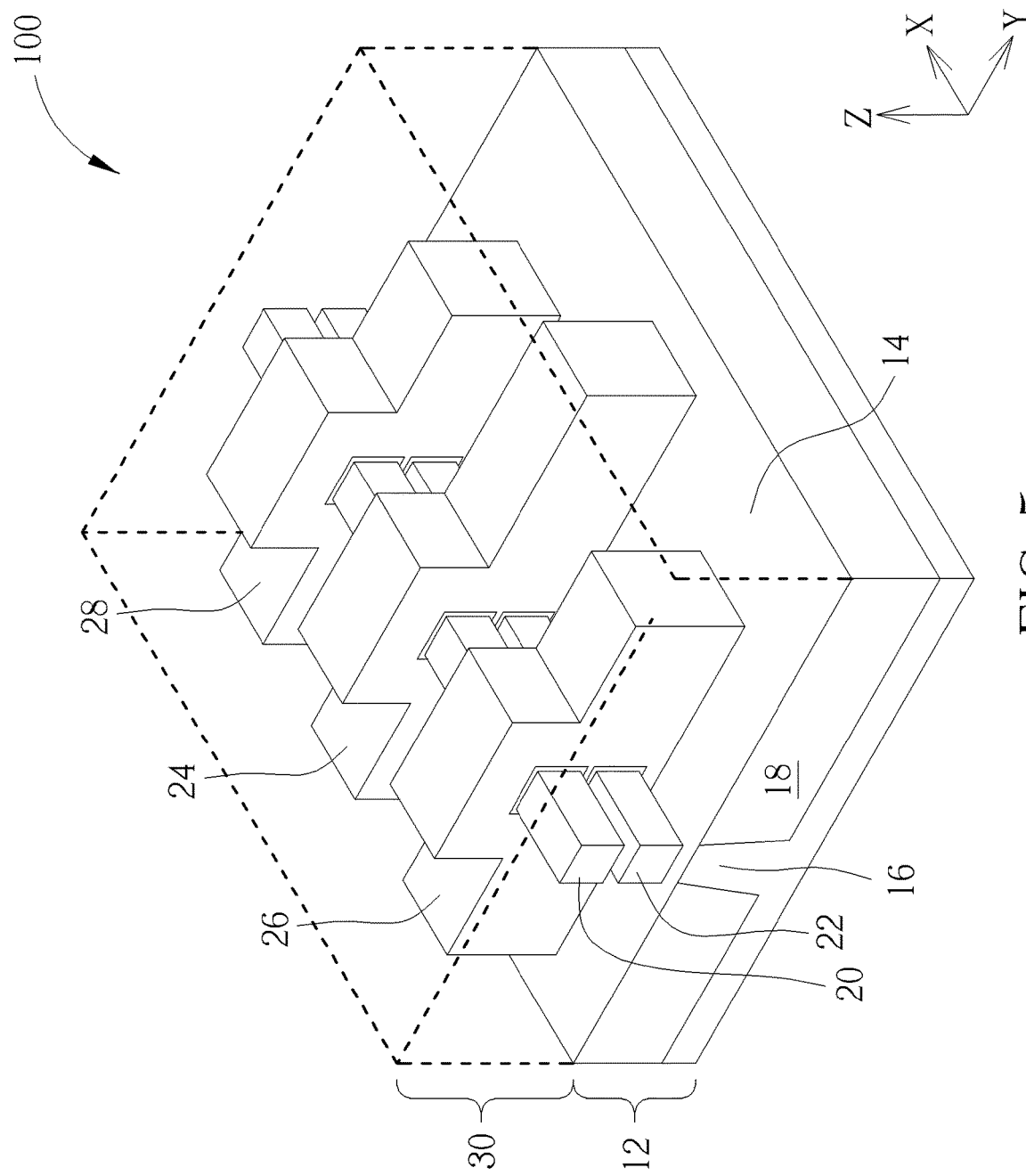
FIG. 5 depicts a three-dimensional figure of a nanowire transistor structure according to a second preferred embodiment of the present invention.
Figure 6:
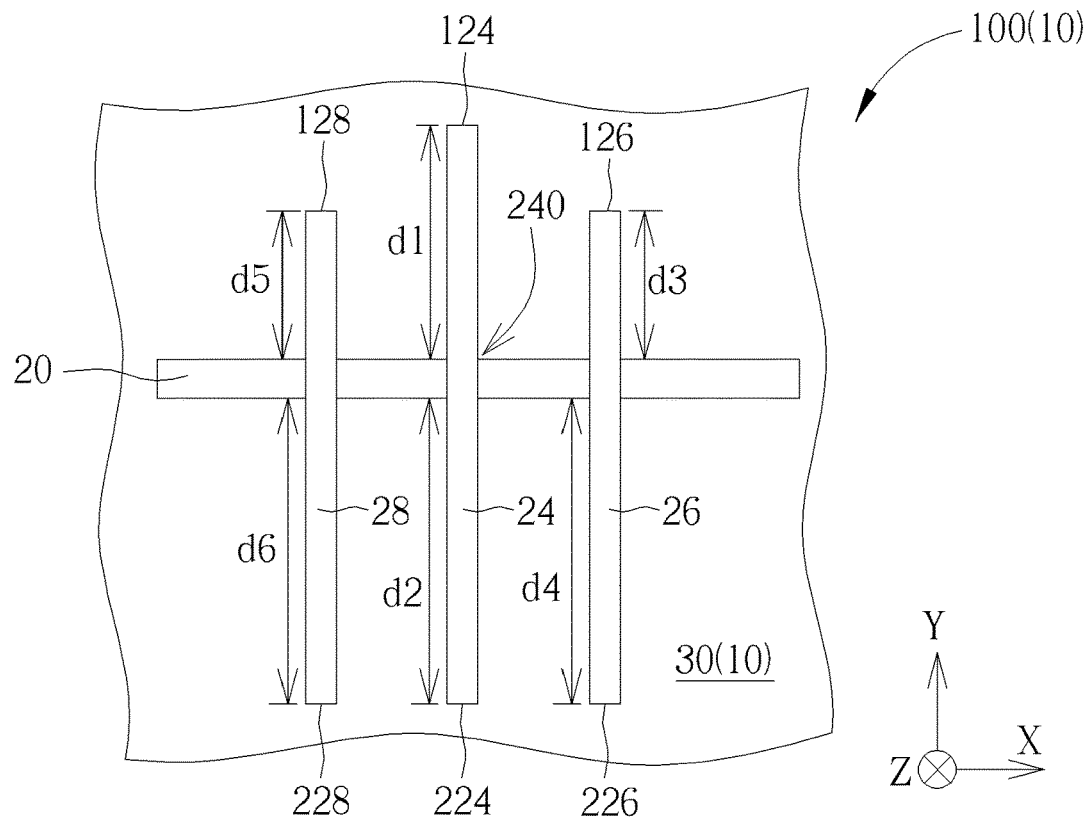
FIG. 6 shows a top view of FIG. 5.
Figure 7:
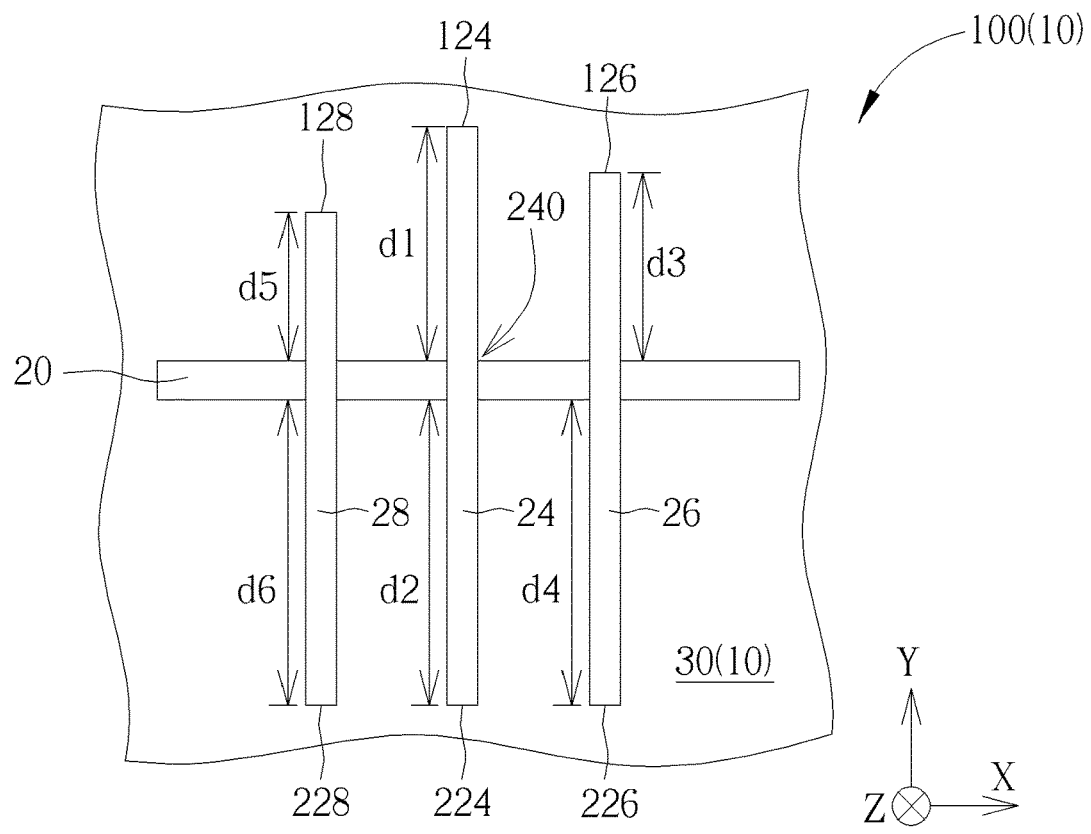
FIG. 7 depicts a nanowire transistor structure according to a modification of the second preferred embodiment of the present invention.
Figure 8:
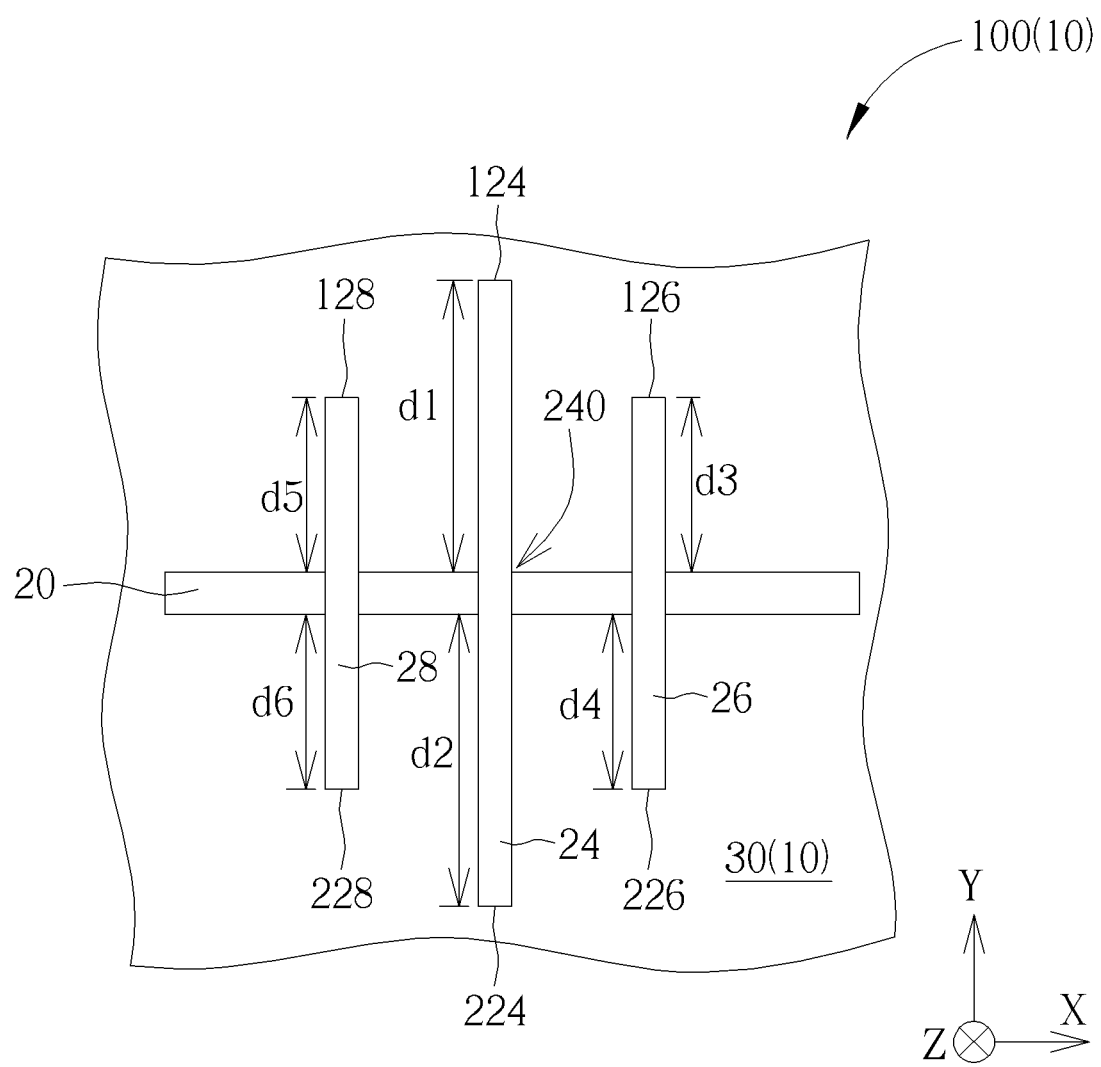
FIG. 8 depicts another nanowire transistor structure according to a modification of the second preferred embodiment of the present invention.

FIG. 5 depicts a three-dimensional figure of a nanowire transistor structure according to a second preferred embodiment of the present invention. FIG. 6 shows a top view of FIG. 5. FIG. 7 depicts a nanowire transistor structure according to a modification of a second preferred embodiment of the present invention in a top view. FIG. 8 depicts another nanowire transistor structure according to a modification of a second preferred embodiment of the present invention in a top view. Elements which are substantially the same as those in the first preferred embodiment are denoted by the same reference numerals.

The difference between the first preferred embodiment and the second preferred embodiment is the rule for disposing the end of the gate line. In the second preferred embodiment, except for the first gate line 24, each of the other gate lines has at least one end which is arranged following the rule that: the gate line nearer the first gate line 24 along the first direction X has an end farther from the first nanowire 20 along the second direction Y, the gate line farther from the first gate line 24 along the first direction X has an end nearer the first nanowire 20 along the second direction Y, and the distance between the end and the first nanowire 20 is not larger than the first distance d1. Other elements such as the substrate 12, the first nanowire 20, the second nanowire 22, the fin structure 16, the interlayer dielectric layer 30, the first gate line 24 and the second gate line 26 are the same as those in the first preferred embodiment, and an accompanying explanation is therefore omitted.

Please refer to FIG. 5 and FIG. 6. A nanowire transistor structure 10 includes a substrate 12. A first nanowire 20 is suspended on the substrate 12. The second nanowire 22 is optionally suspended on the substrate 12. The first gate line 24 crosses and surrounds the first nanowire 20. The first gate line 24 includes a first end 124 and a second end 224. The second gate line 26 crosses and surrounds the first nanowire 20. The second gate line 26 includes a third end 126 and a fourth end 226. Unlike the first preferred embodiment, in the second embodiment, the first distance d1 between the first end 124 and the first nanowire 20 is larger than the third distance d3 between the third end 126 and the first nanowire 20. The nanowire transistor 10 preferably further includes a third gate line 28 which crosses and surrounds the first nanowire 20. The first gate line 24 is disposed between the second gate line 26 and the third gate line 28. The third gate line 28 has a fifth end 128 and a sixth end 228. The first distance d1 is larger than a fifth distance d5 between the fifth end 128 and the first nanowire 20. The second distance d2 equals a sixth distance d6 between the sixth end 228 and the first nanowire 20. The first gate line 24 overlapping the first nanowire 20 forms a gate structure 240. Source/drain doped regions (not shown) can be formed in the first nanowire 20 at two sides of the gate structure 240. The gate structure 240, the first nanowire 20 and the source/drain doped regions form a nanowire transistor 100.

In the embodiment of FIG. 6, the third distance d3 and the fifth distance d5 are the same. In other cases as shown in FIG. 7, the third distance d3 and the fifth distance d5 can be different, as long as the third distance d3 and the fifth distance d5 are both smaller than the first distance d1. Furthermore, the second end 224 of the first gate line 24, the fourth end 226 of the second gate line 26, and the sixth end 228 of the third gate line 28 can be aligned to each other as shown in FIG. 6 and FIG. 7. In other cases, the second end 224, the fourth end 226 and the sixth end 228 are not aligned as shown in FIG. 8. In detail, as shown in FIG. 8, the second distance d2 is larger than the fourth distance d4 and the sixth distance d6. The fourth distance d4 equals the sixth distance d6. In other embodiments, the second distance d2 is larger than the fourth distance d4 and larger than the sixth distance d6, but the fourth distance d4 does not equal the sixth distance d6. In the second embodiment, under the circumstance that the second end 224, the fourth end 226 and the sixth end 228 are not aligned, the efficiency of the nanowire transistor 100 is twice the efficiency of the nanowire transistor 100 with the second end 224, the fourth end 226 and the sixth end 228 aligned. The numbers of the nanowire and the gate lines of the nanowire transistor 100 in the embodiments shown in FIG. 6 to FIG. 8 can be increased based on different requirements. The added nanowire can be disposed along the vertical direction Z, and aligned with the first nanowire 20 entirely. The added gate line can be disposed at one side of the second gate line 26 or the third gate line 28. The position of the end of the added gate line can be disposed following the rule mentioned in the second preferred embodiment.

Figure 11:
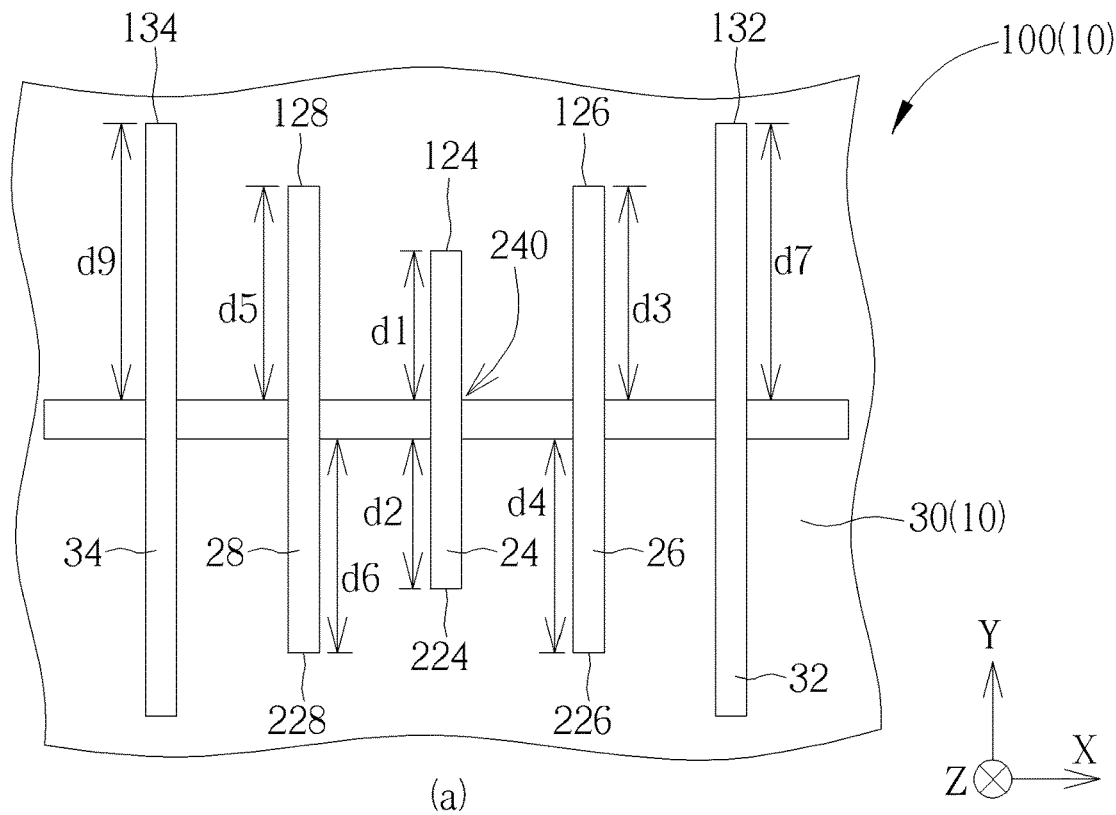
FIG. 11 depicts two examples of modifications of a nanowire transistor structure of the present invention.
Figure 11:
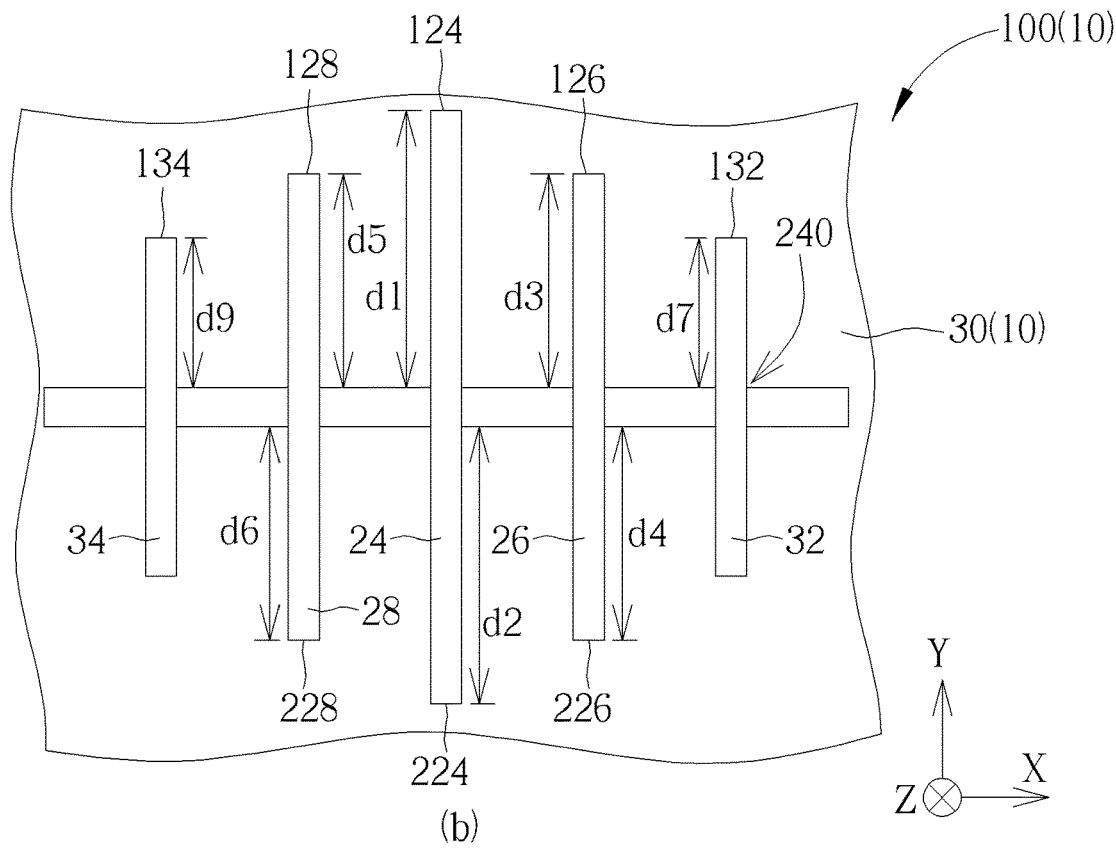

For example, as shown in example (b) of FIG. 11, a fourth gate line 32 is added to one side of the second gate line 26, and a fifth gate line 34 is added to one side of the third gate line 28. Compared to the second gate line 26, the fourth gate line 32 is farther from the first gate line 24 along the first direction X; therefore, a seventh distance d7 between an end 132 of the fourth gate line 32 and the first nanowire 20 is smaller than the third distance d3 along the second direction Y. Compared to the third gate line 28, the fifth gate line 34 is farther from the first gate line 24 along the first direction X; therefore, a ninth distance d9 between an end 134 of the fifth gate line 34 and the first nanowire 20 is smaller than the fifth distance d5 along the second direction Y.

An interlayer dielectric layer 30 encapsulates the first end 124, the second end 224, the third end 126 and the fourth end 226, the fifth end 128 and the sixth end 228. When the interlayer dielectric layer 30 is tensile stress, the gate structure 240 is a gate structure of a P-type transistor, and the nanowire transistor 100 is a P-type transistor; when the interlayer dielectric layer 30 is compressive stress, the gate structure 240 is a gate structure of an N-type transistor, and the nanowire transistor 100 is an N-type transistor.

Figure 9:
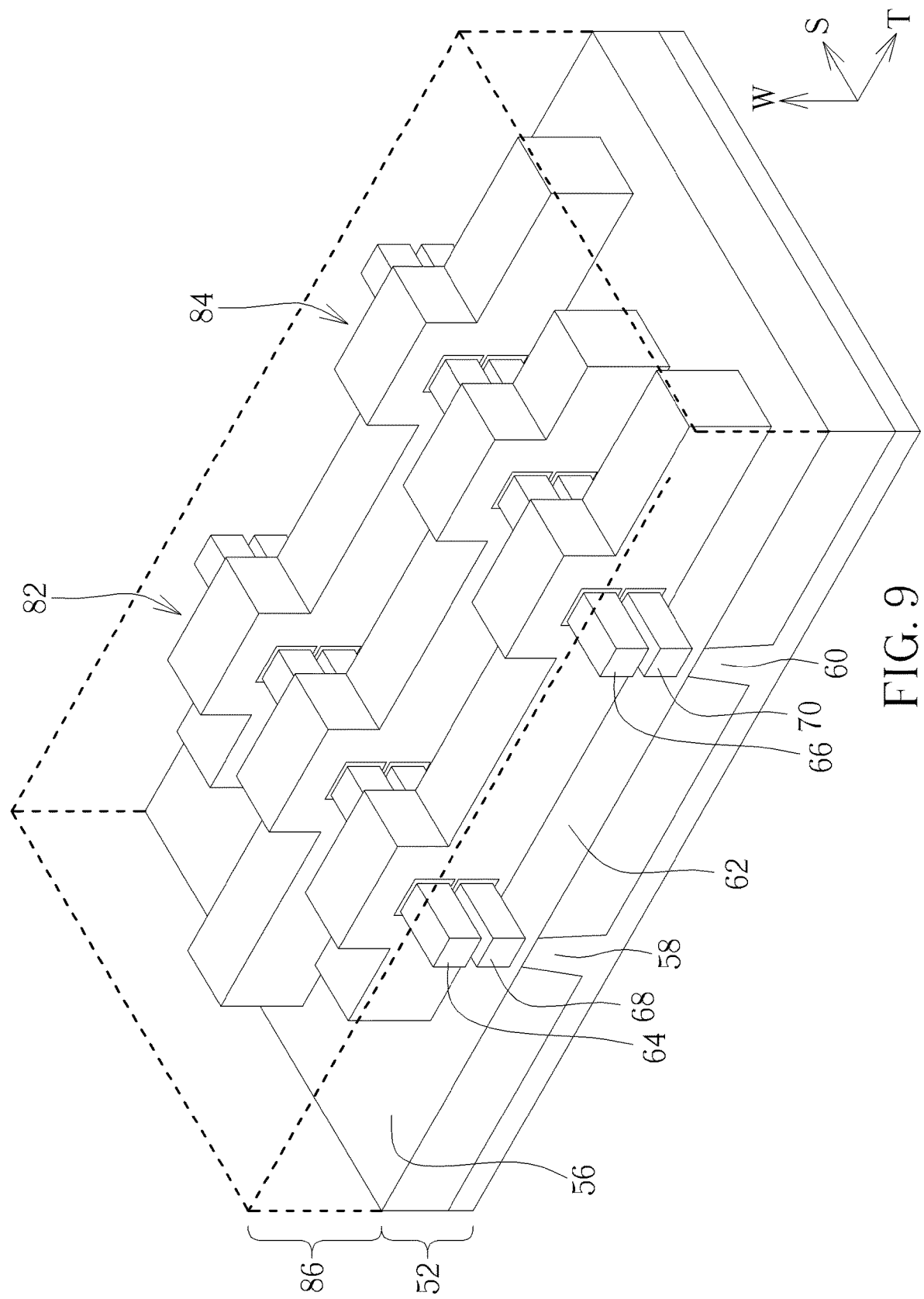
FIG. 9 depicts a three-dimensional view of an inverter structure according to a third preferred embodiment of the present invention.
Figure 10:
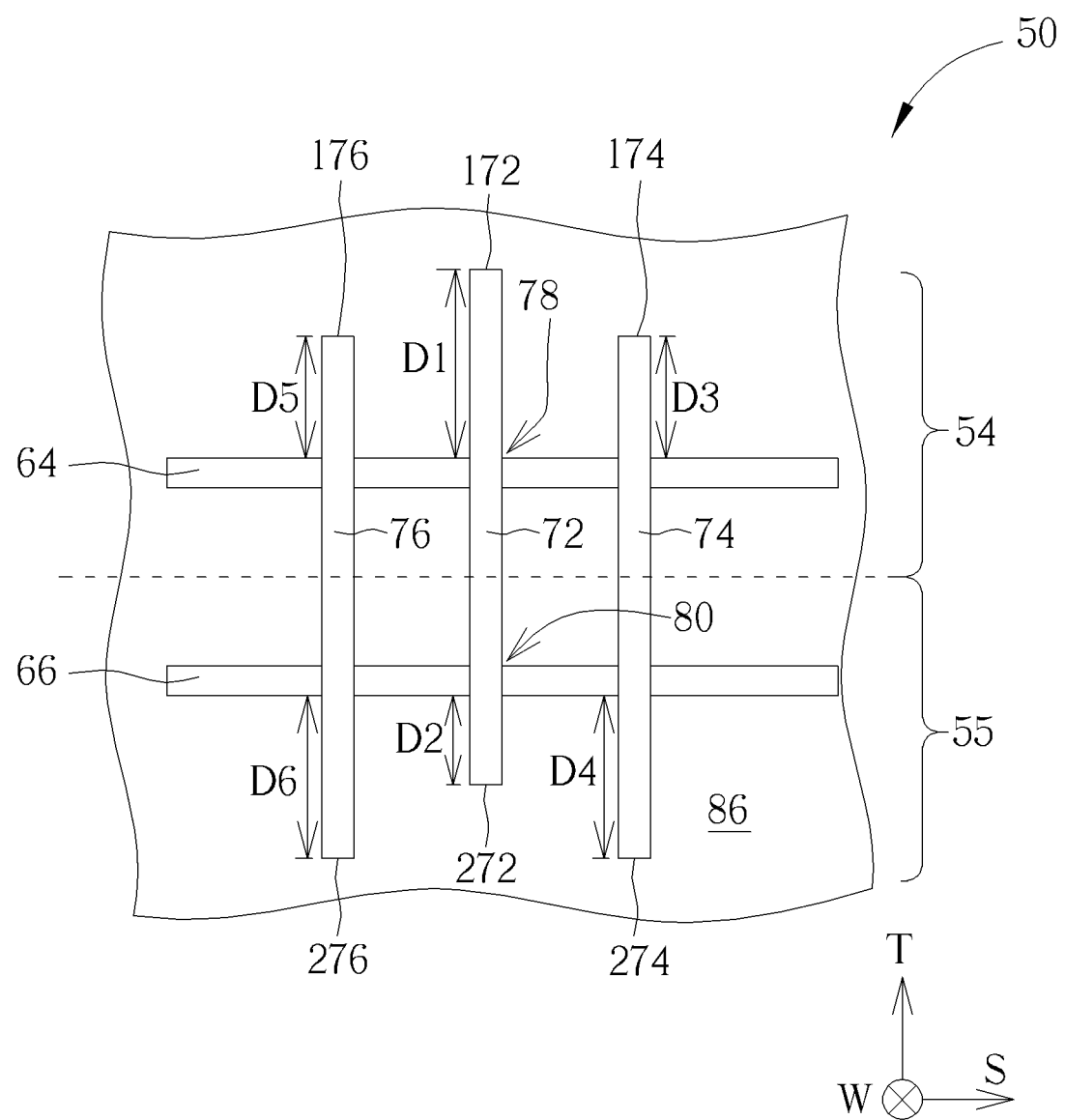
FIG. 10 depicts a top view of FIG. 9.

FIG. 9 depicts a three-dimensional view of an inverter structure according to a third preferred embodiment of the present invention. FIG. 10 is a top view of FIG. 9. As shown in FIG. 9 and FIG. 10, an inverter structure includes a substrate 50. The substrate 50 is divided into a first-type transistor region 54 and a second-type transistor region 55. A first direction S, a second direction T and a vertical direction W are defined on the substrate 52. The first direction S and the second direction T are parallel to a top surface 56 of the substrate 52. The vertical direction Z is perpendicular to the top surface 56. The first direction S is perpendicular to the second direction T. The substrate 12 includes a first fin structure 58 and a second fin structure 60. An STI 62 surrounds the first structure 58 and the second fin structure 60. The first fin structure 58 and the second fin structure 60 may be semiconductor materials such as silicon, germanium, silicon germanium, or silicon carbide. The STI 62 is preferably silicon oxide or other insulating material. A first nanowire 64 is suspended on the substrate 52 and entirely within the first-type transistor region 54. The first nanowire 64 is disposed directly on the fin structure 58 and entirely overlaps the fin structure 58 in the vertical direction W. The first nanowire 64 is parallel to the first direction S. A second nanowire 66 is suspended on the substrate 52 and entirely within the second-type transistor region 55. The second nanowire 66 is disposed directly on the second fin structure 60 and entirely overlaps the second fin structure 60 in the vertical direction W. The second nanowire 66 is parallel to the first direction S. According to another preferred embodiment, the inverter structure further includes a third nanowire 68 suspended on the substrate 52 and entirely aligns the first nanowire 64 along the vertical direction W. The material of the first nanowire 64, the second nanowire 66, the third nanowire 68 and the fourth nanowire 70 are the same as that of the first fin structure 58 and the second fin structure 60.

A first gate line 72 is disposed within the first-type transistor region 54 and the second-type transistor region 55 and is perpendicular to the first nanowire 64 and the second nanowire 66. The first gate line 72 includes a first end 172 within the first-type transistor region 54 and a second end 272 within the second-type transistor region 55. A second gate line 74 is disposed within the first-type transistor region 54 and the second-type transistor region 55 and is perpendicular to the first nanowire 64 and the second nanowire 66. The second gate line 74 includes a third end 174 within the first-type transistor region 64 and a fourth end 274 within the second-type transistor region 55. A first distance D1 between the first end 172 and the first nanowire 64 is larger than a third distance D3 between the third end 174 and the first nanowire 64 and a second distance D2 between the second end 272 and the second nanowire 66 is smaller than a fourth distance D4 between the fourth end 274 and the second nanowire 66. The first distance D1, the second distance D2, the third distance D3 and the fourth distance D4 are parallel to the second direction T. The first gate line 72 overlapping the first nanowire 64 is defined as a first-type gate structure 78. Source/drain doped regions (not shown) are disposed in the first nanowire 64 at two sides of the first-type gate structure 78. The first-type gate structure 78, the first nanowire 64 and the source/drain doped regions form a first-type transistor 82. The first gate line 72 overlapping the second nanowire 66 is defined as a second-type gate structure 80. Source/drain doped regions (not shown) are disposed in the second nanowire 66 at two sides of the second-type gate structure 80. The second-type gate structure 80, the second nanowire 66 and the source/drain doped regions form a second-type transistor 84. The first-type transistor 82 and the second-type transistor form an inverter.

According to a preferred embodiment of the present invention, the inverter structure 50 can further include a third gate line 76 disposed in the first-type transistor region 54 and the second-type transistor region 55. The third gate line 76 is perpendicular to the first nanowire 64. The first gate line 72 is disposed between the third gate line 76 and the second gate line 74. The third gate line 76 has a fifth end 176 within the first-type transistor region 54 and a sixth end 276 within the second-type transistor region 55. The first distance D1 is larger than a fifth distance D5 between the fifth end 176 and the first nanowire 64. The second distance D2 is smaller than a sixth distance D6 between the sixth end 276 and the second nanowire 66. The fifth distance D5 and the sixth distance D6 are parallel to the second direction T. Moreover, the third distance D3 may be equal to or different from the fifth distance D5. The fourth distance D4 may be equal to or different from the sixth distance D6. In FIG. 10, the third distance D3 equals the fifth distance D5, and the fourth distance D4 equals the sixth distance D6. Furthermore, the first gate line 72 has an applied voltage. The second gate line 74 and the third gate line 76 may respectively have an applied voltage or be floating. The first gate line 74, the second gate line 74 and the third gate line 76 respectively include a gate and a gate dielectric layer. The gate may be a conductive material such as doped polysilicon or metal. The gate dielectric layer may be silicon oxide ($SiO_2$), silicon nitride ($Si_3N_4$), silicon carbon nitride (SiCN), silicon oxynitride (SiON), silicon oxycarbonitride (SiOCN), or high-k dielectrics having a dielectric constant greater than 5.

The inverter structure 50 further includes an interlayer dielectric layer 86 encapsulating the first end 172, the second end 272, the third end 174 and the fourth end 274. If there is a third gate line 76, the interlayer dielectric layer 86 also encapsulates the fifth end 176 and the sixth end 276. The interlayer dielectric layer 86 is preferably silicon nitride. When the interlayer dielectric layer 86 is tensile stress, the first-type transistor region 54 is a P-type transistor region, and the second-type transistor region 55 is an N-type transistor region, i.e. the first-type transistor 82 is P-type and the second-type transistor 84 is N-type. When the interlayer dielectric layer 86 is compressive stress, the first-type transistor region 54 is an N-type transistor region, and the second-type transistor region 55 is a P-type transistor region, i.e. the first-type transistor 82 is N-type and the second-type transistor 84 is P-type.

The gate lines in the present invention are adjusted according to the stress type of the interlayer dielectric layer, and the conductive type of the transistor. Therefore, the efficiency of both the nanowire transistor and the inverter are increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor structure, comprising:
   a substrate;
   a first nanowire disposed on the substrate;
   a first gate line crossing and surrounding the first nanowire, wherein the first gate line has a first end and a second end;
   a second gate line crossing and surrounding the first nanowire, wherein the second gate line has a third end and a fourth end;
   a third gate line crossing and surrounding the first nanowire, wherein the first gate line is disposed between the second gate line and the third gate line, the third gate line comprises a fifth end and a sixth end, and wherein there is not any gate line between the first gate line and the second gate line, and there is not any gate line between the first gate line and the third gate line; and
   an interlayer dielectric layer encapsulating the first end, the second end, the third end and the fourth end; wherein a first distance between the first end and the first nanowire is smaller than a third distance between the third end and the first nanowire, and the first distance is smaller than a fifth distance between the fifth end and the first nanowire.

2. The transistor structure of claim 1, wherein a second distance between the second end and the first nanowire equals a fourth distance between the fourth end and the first nanowire.

3. The transistor structure of claim 1, wherein a second distance between the second end and the first nanowire is smaller than a fourth distance between the fourth end and the first nanowire.

4. The transistor structure of claim 1, wherein the first end and the third end are disposed at the same side of the first nanowire.

5. The transistor structure of claim 1, wherein a second distance between the second end and the first nanowire equals a sixth distance between the sixth end and the first nanowire.

6. The transistor structure of claim 1, wherein a second distance between the second end and the first nanowire is smaller than a sixth distance between the sixth end and the first nanowire.

7. The transistor structure of claim 1, wherein the first gate line overlapping the first nanowire forms a gate structure.

8. The transistor structure of claim 7, wherein the interlayer dielectric layer comprises tensile stress, and the gate structure is a gate structure of an N-type transistor.

9. The transistor structure of claim 7, wherein the interlayer dielectric layer comprises compressive stress, and the gate structure is a gate structure of a P-type transistor.

10. The transistor structure of claim 1, wherein the substrate comprises a top surface, a vertical direction is perpendicular to the top surface, and the transistor structure further comprises a second nanowire disposed on the substrate, and the second nanowire aligned with the first nanowire along the vertical direction.

\* \* \* \* \*